United States Patent
Ikeda et al.

(10) Patent No.: US 10,056,150 B2
(45) Date of Patent: Aug. 21, 2018

(54) NON-VOLATILE SEMICONDUCTOR MEMORY DEVICE

(71) Applicant: TOSHIBA MEMORY CORPORATION, Minato-ku (JP)

(72) Inventors: Keiji Ikeda, Kawasaki (JP); Chika Tanaka, Fujisawa (JP); Toshinori Numata, Yokkaichi (JP); Tsutomu Tezuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/452,178

(22) Filed: Mar. 7, 2017

(65) Prior Publication Data

US 2018/0082750 A1 Mar. 22, 2018

(30) Foreign Application Priority Data

Sep. 20, 2016 (JP) .................................. 2016-183295

(51) Int. Cl.
 *G11C 11/34* (2006.01)
 *G11C 16/24* (2006.01)
 (Continued)

(52) U.S. Cl.
 CPC .......... *G11C 16/24* (2013.01); *G11C 16/0483* (2013.01); *H01L 27/1157* (2013.01);
 (Continued)

(58) Field of Classification Search
 CPC ................ G11C 16/24; G11C 16/0483; H01L 27/11519; H01L 27/11565; H01L 27/11524; H01L 27/1157; H01L 27/11586
 (Continued)

(56) References Cited

U.S. PATENT DOCUMENTS 9,152,350 B2   10/2015  Marukame et al.
9,682,272 B2 *  6/2017  Januszek ............ A63B 21/0724
              (Continued)

FOREIGN PATENT DOCUMENTS

JP   2014-116516 A   6/2014
JP       5631938 B2  11/2014
JP   2017-168623 A   9/2017

OTHER PUBLICATIONS

R. Brain et al., "A 22nm High Performance Embedded DRAM SoC Technology Featuring Tri-gate Transistors and MIMCAP COB" 2013 Symposium on VLSI Technology (VLSIT) Digest of Technical Papers, Jun. 11-13, 2013, pp. T16-T17.
(Continued)

*Primary Examiner* — Viet Q Nguyen
(74) *Attorney, Agent, or Firm* — Oblon, McClelland, Maier & Neustadt, L.L.P.

(57) ABSTRACT

According to one embodiment, a non-volatile semiconductor memory device is disclosed. The device includes a semiconductor substrate, and a memory cell array provided on the semiconductor substrate. The memory cell array includes a plurality of memory transistors which are electrically rewritable and arranged in a three-dimensional manner. The device further includes a latch provided above the semiconductor substrate and configured to hold data that is to be written in the memory cell array. The latch includes a capacitor and a first field-effect transistor which is connected to the capacitor and includes a first oxide semiconductor layer.

18 Claims, 17 Drawing Sheets

(51) Int. Cl.
*H01L 27/11519* (2017.01)
*H01L 27/11565* (2017.01)
*H01L 27/11524* (2017.01)
*H01L 27/1157* (2017.01)
*H01L 27/11556* (2017.01)
*H01L 27/11582* (2017.01)
*G11C 16/04* (2006.01)

(52) U.S. Cl.
CPC .. *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
USPC ..................................... 365/185.05, 185.11
See application file for complete search history.

(56) References Cited

U.S. PATENT DOCUMENTS

| | | | |
|---|---|---|---|
| 9,698,272 B1 | 7/2017 | Ikeda et al. | |
| 2004/0032764 A1* | 2/2004 | Koga | G11C 11/4023 365/189.05 |
| 2005/0162895 A1* | 7/2005 | Kuhr | B82Y 10/00 365/151 |
| 2005/0207229 A1* | 9/2005 | Takeuchi | G11C 8/08 365/185.25 |
| 2010/0027353 A1* | 2/2010 | Kwon, II | G11C 16/16 365/185.33 |
| 2012/0155190 A1* | 6/2012 | Kim | G11C 11/5628 365/189.05 |
| 2012/0182804 A1* | 7/2012 | Hung | G11C 16/0483 365/185.13 |
| 2013/0135934 A1 | 5/2013 | Kim et al. | |
| 2016/0071599 A1* | 3/2016 | Hsu | G11C 16/10 365/185.12 |
| 2016/0267988 A1* | 9/2016 | Ogawa | G11C 16/10 |

OTHER PUBLICATIONS

Seon Yong Cha, "DRAM Technology—History & Challenges," 2011 IEDM Short Course : Advanced Memory Technology, Dec. 4, 2011, pp. 1-73.

Teruyoshi Hatanaka et al., "Ferroelectric (Fe)-NAND Flash Memory With Batch Write Algorithm and Smart Data Store to the Nonvolatile Page Buffer for Data Center Application High-Speed and Highly Reliable Enterprise Solid-State Drives" IEEE Journal of Solid-State Circuits, vol. 45, No. 10, Oct. 2010, pp. 2156-2164.

Sungjoo Hong, "Memory Technology Trend and Future Challenges" 2010 IEEE International Electron Devices Meeting (IEDM), Dec. 6-8, 2010, pp. 12.4.1-12.4.4.

Deok-Sin Kil, et al., "Development of New TiN/$ZrO_2$/$Al_2O_3$/$ZrO_2$/TiN Capacitors Extendable to 45nm Generation DRAMs Replacing $HfO_2$ based Dielectrics" 2006 Symposium on VLSI Technology Digest of Technical Papers, Jun. 2006, 2 pages.

Noboru Shibata, et al., "A 70nm 16Gb 16-level-cell NAND Flash Memory" 2007 Symposium on VLSI Circuits Digest of Technical Papers, Jun. 2007, pp. 190-191.

Daisaburo Takashima, et al., "An Embedded DRAM Technology for High-Performance NAND Flash Memories" 2011 IEEE International Solid-State Circuits Conference Digest of Technical Papers (ISSCC), Session 28, Feb. 2011, pp. 504-505.

Ken Takeuchi, et al., "A Dual-p. Programming Scheme for High-Speed Multigigabit-Scale NAND Flash Memories" IEEE Journal of Solid-State Circuits, vol. 36, No. 5, May 2001, pp. 744-751.

Ken Takeuchi, et al., "A 56-nm CMOS 99-$mm^2$ 8-Gb Multi-Level NAND Flash Memory With 10-MB/s Program Throughput" IEEE Journal of Solid-State Circuits, vol. 42, No. 1, Jan. 2007, pp. 219-232.

\* cited by examiner

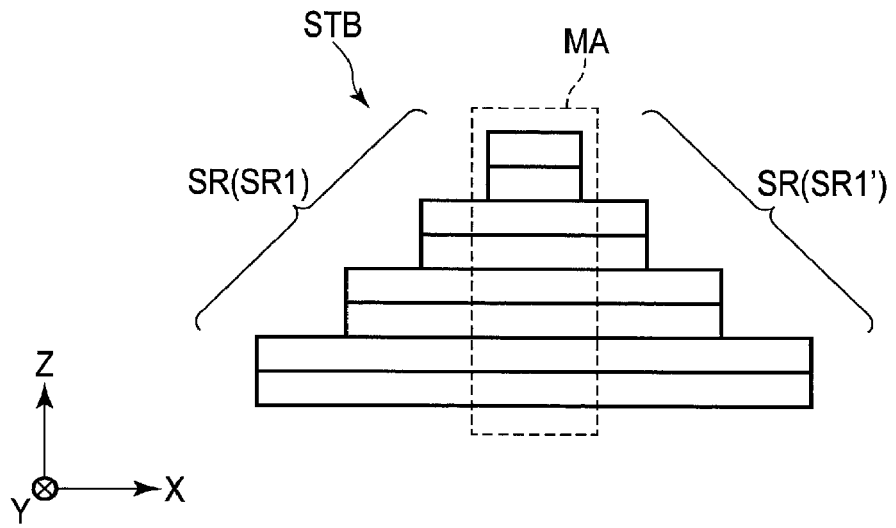
F I G. 2C
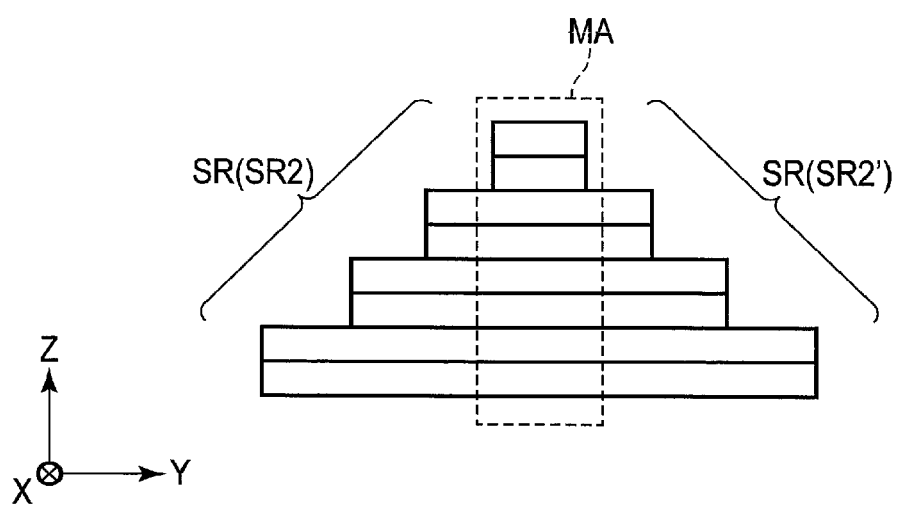
F I G. 2D

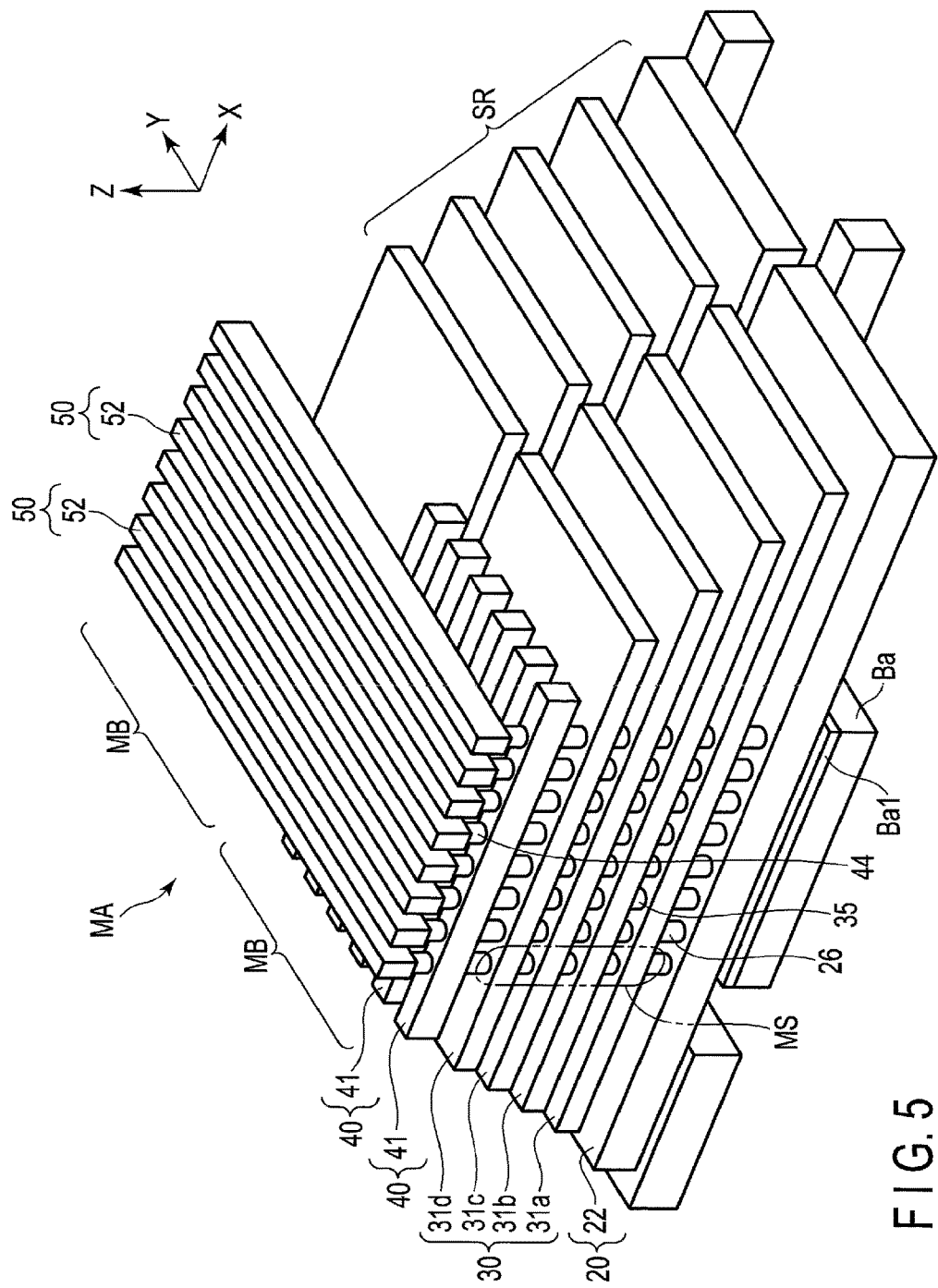
F I G. 5

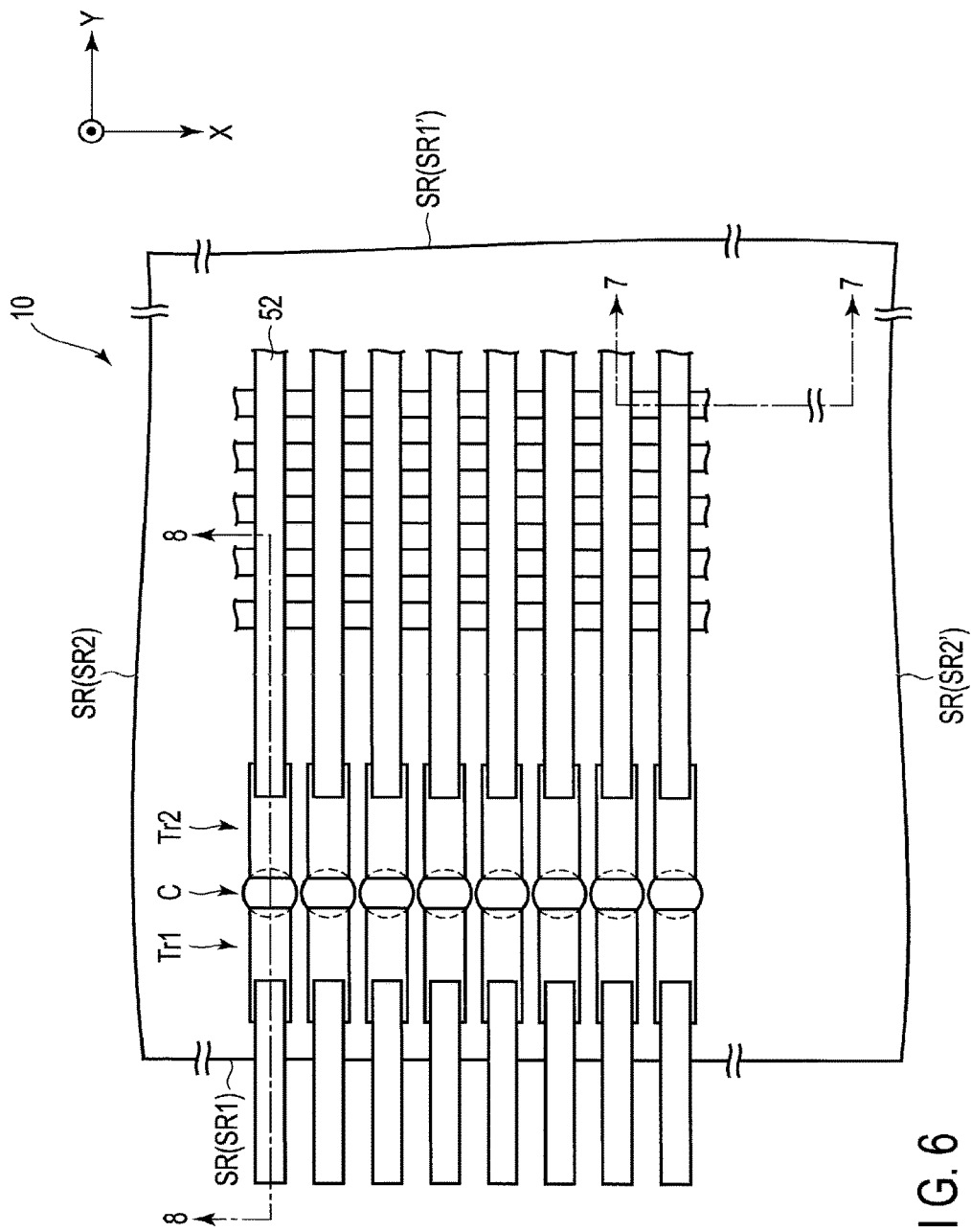
F I G. 6

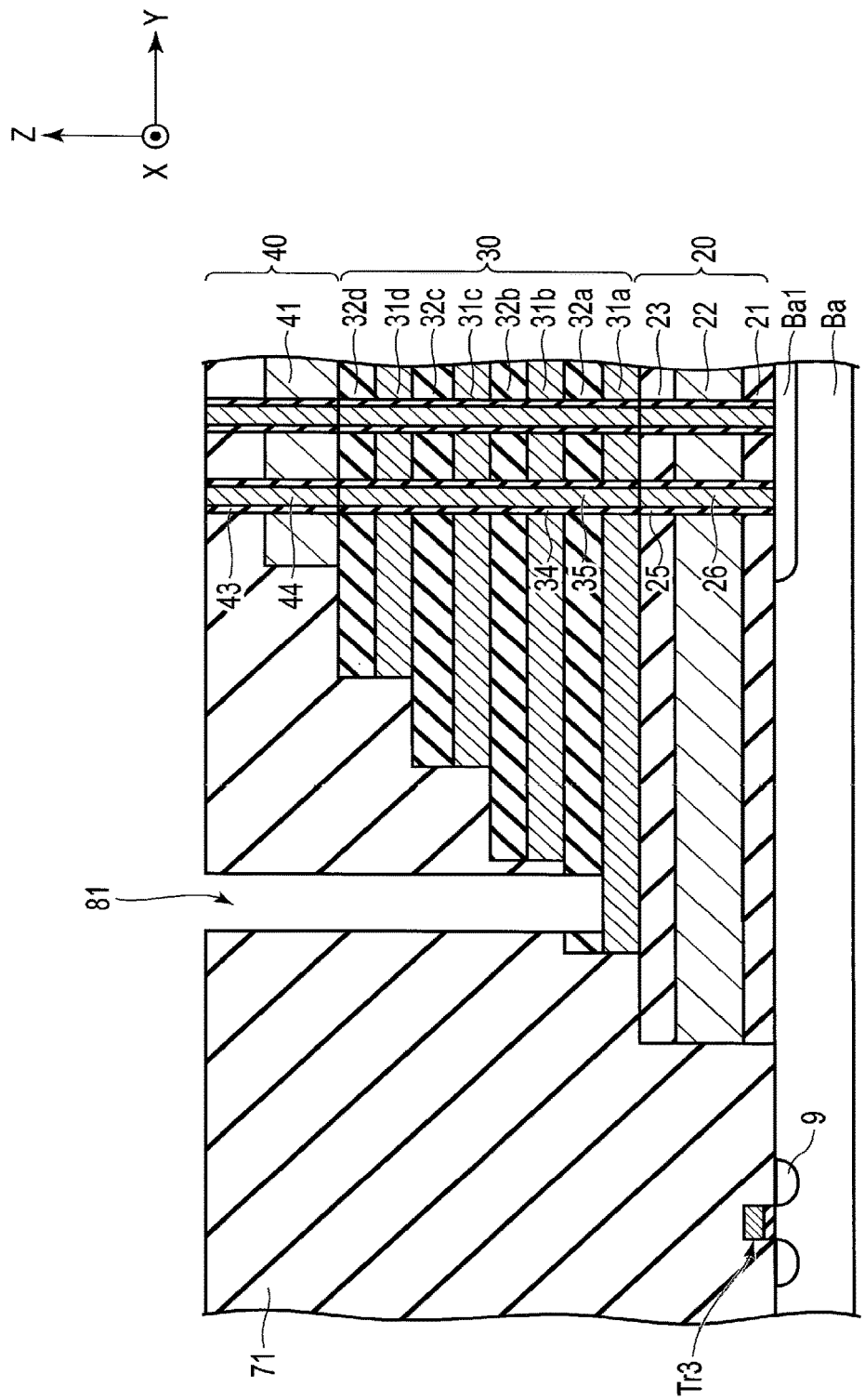
F I G. 11

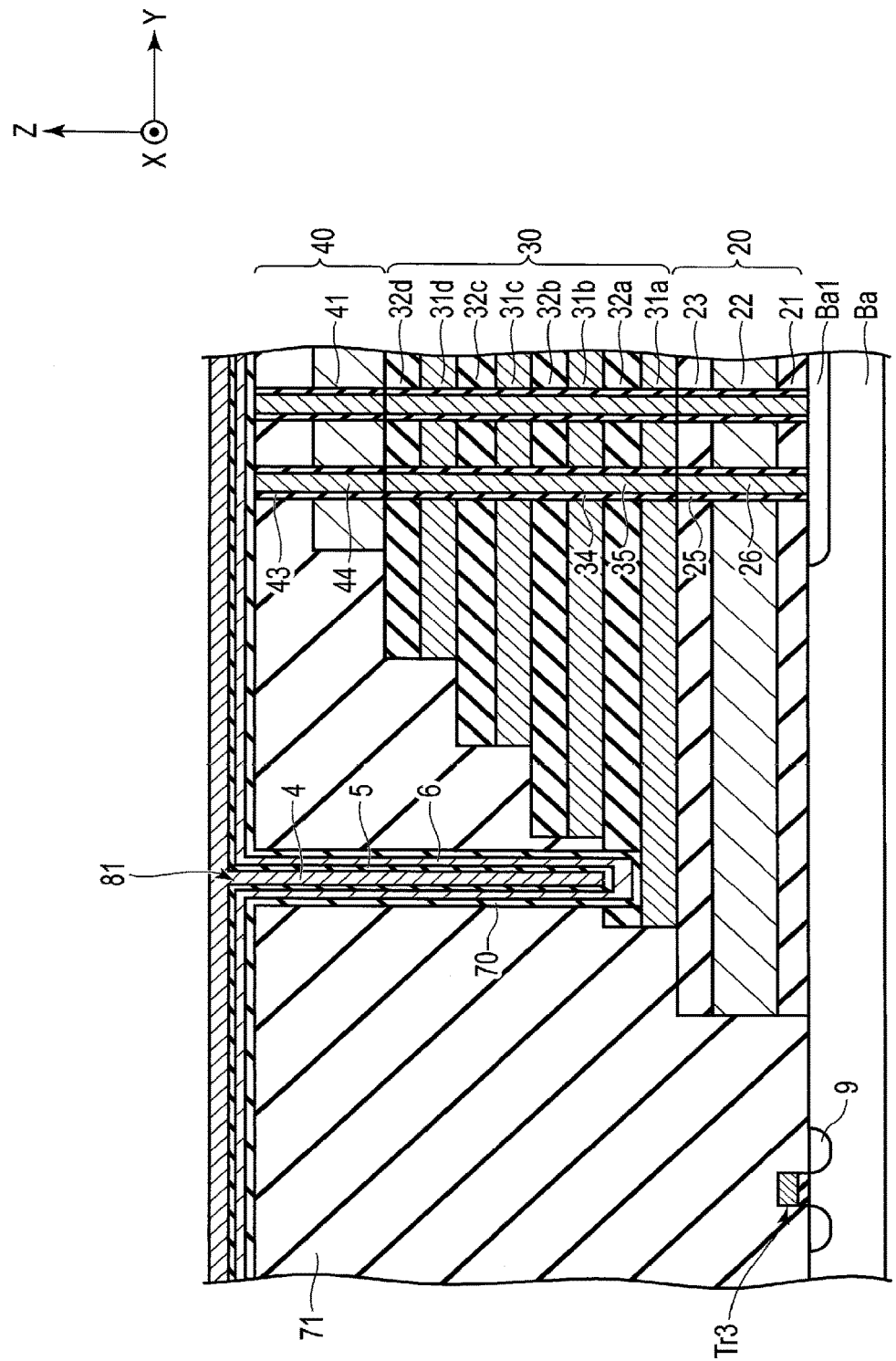
F I G. 12

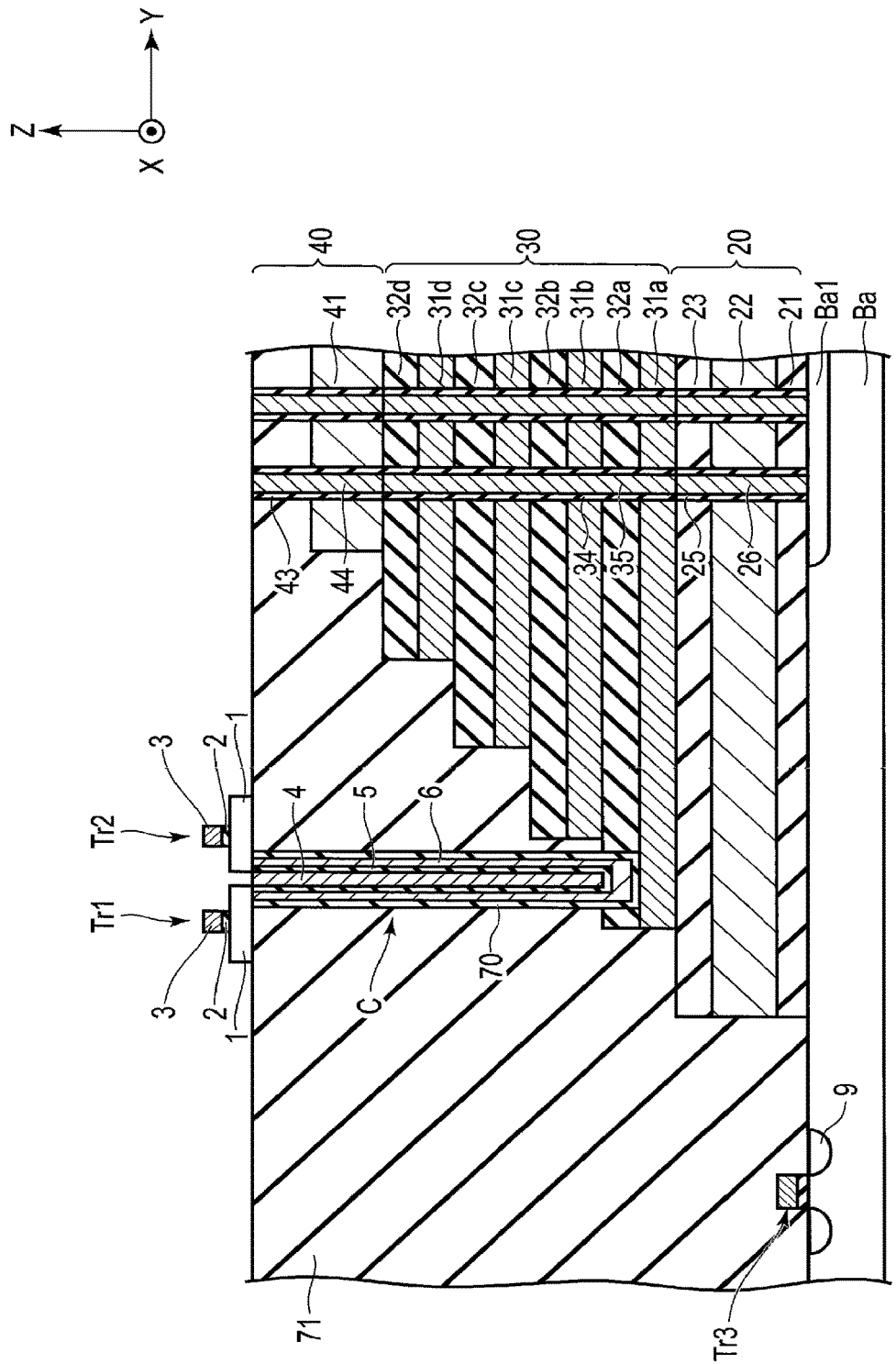
F I G. 15

NON-VOLATILE SEMICONDUCTOR MEMORY DEVICE

CROSS-REFERENCE TO RELATED APPLICATIONS

This application is based upon and claims the benefit of priority from Japanese Patent Application No. 2016-183295, filed Sep. 20, 2016, the entire contents of which are incorporated herein by reference.

FIELD

Embodiments described herein relate generally to a non-volatile semiconductor memory device.

BACKGROUND

A NAND type flash memory employs a page buffer as a buffer memory to reduce programming time. The page buffer includes, for example, an inverter latch circuit.

BRIEF DESCRIPTION OF THE DRAWINGS

FIG. 2C is a sectional view taken along line 2C-2C in FIG. 2B.

FIG. 2D is a sectional view taken along line 2D-2D in FIG. 2B.

FIG. 5 is a schematic perspective view of a memory cell array.

FIG. 6 is a top view illustrating a peripheral circuit area, a memory cell array and a stair-like step portion of the NAND type flash memory according to the embodiment.

FIG. 11 is a sectional view for explaining the method of manufacturing the NAND type flash memory according to the embodiment subsequent to FIG. 10.

FIG. 12 is a sectional view for explaining the method of manufacturing the NAND type flash memory according to the embodiment subsequent to FIG. 11.

FIG. 15 is a sectional view for explaining the method of manufacturing the NAND type flash memory according to the embodiment subsequent to FIG. 14.

DETAILED DESCRIPTION

Figure 1:
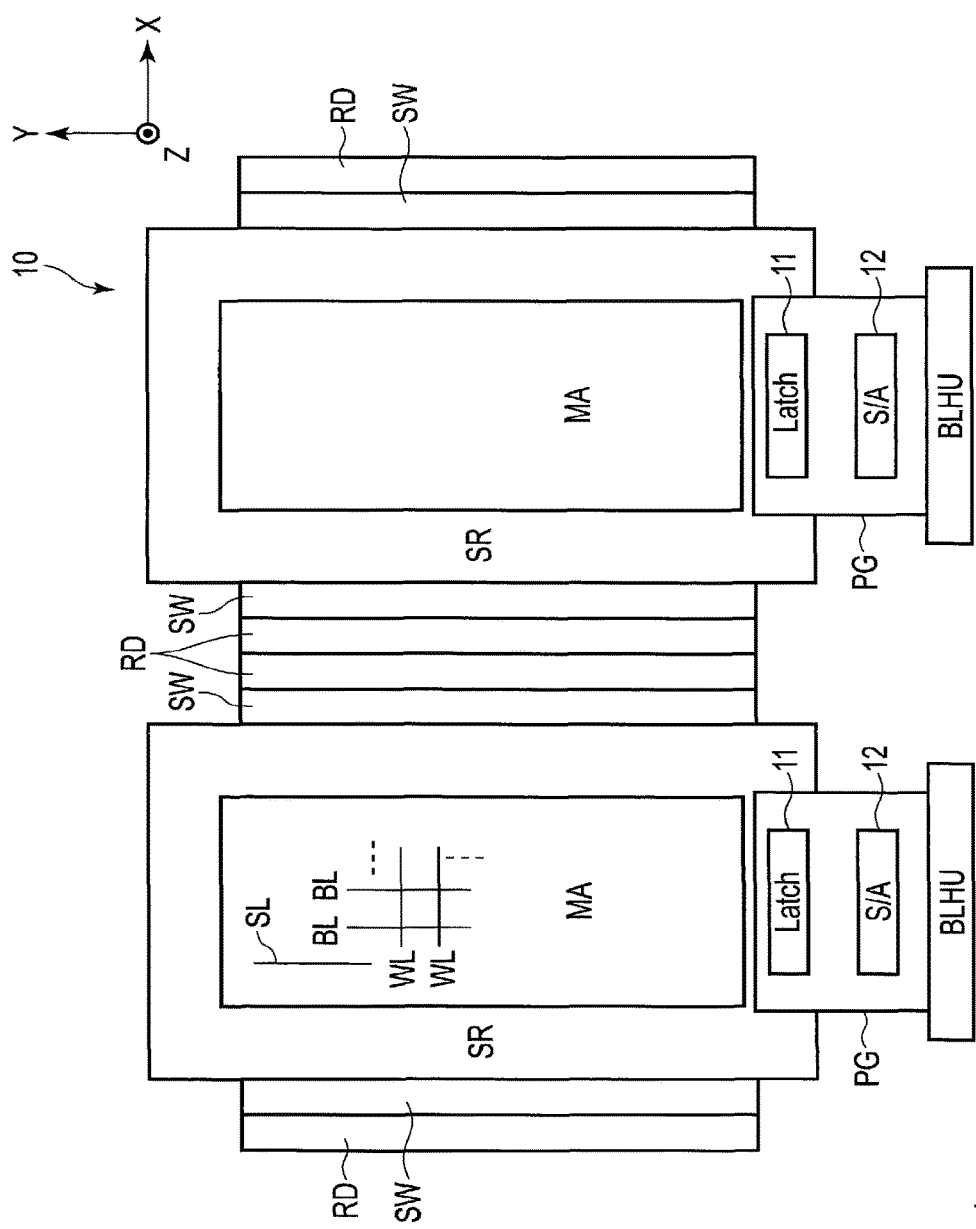
FIG. 1 is a block diagram illustrating a schematic configuration of a NAND type flash memory according to an embodiment.

In general, according to one embodiment, a non-volatile semiconductor memory device is disclosed. The device includes a semiconductor substrate, and a memory cell array provided on the semiconductor substrate. The memory cell array includes a plurality of memory transistors which are electrically rewritable and arranged in a three-dimensional manner. The device further includes a latch provided above the semiconductor substrate and configured to hold data that is to be written in the memory cell array. The latch includes a capacitor and a first field-effect transistor which is connected to the capacitor and includes a first oxide semiconductor layer.

Embodiments will be described hereinafter with reference to the accompanying drawings. The drawings are schematic and conceptual, and the dimensions, the proportions, etc., of each of the drawings are not necessarily the same as those in reality. Further, in the drawings, the same reference symbols denote the same or corresponding portions, and overlapping explanations thereof will be made as necessary. In addition, as used in the description and the appended claims, the singular forms "a", "an", and "the" are intended to include the plural forms as well, unless clearly described.

FIG. 1 is a block diagram illustrating a schematic configuration of a NAND type flash memory according to an embodiment. An XYZ orthogonal coordinate system will be introduced hereinafter in the present specification, for convenience of description. In this coordinate system, the X axis is parallel to the row direction, the Y axis is parallel to the column direction, and the Z axis is orthogonal to both the X axis and the Y axis.

As shown in FIG. 1, the NAND type flash memory 10 comprises a memory cell array MA. The NAND type flash memory 10 further comprises a peripheral circuit provided on the periphery of the memory cell array MA. The peripheral circuit includes a row recorder RD, a word line connection circuit SW, a bit line connection circuit BLHU, and a page buffer PF and the like. The peripheral circuit controls the memory cell array MA.

The memory cell array MA comprises a plurality of memory transistor (not shown) which are electrically rewritable and three-dimensionally arranged as described later. In addition, the memory cell array MA comprises a plurality of word lines WL extending along the X axis of FIG. 1, a plurality of bit lines BL and a source line SL which extend along the Y axis of FIG. 1.

The memory cell array MA comprises a plurality of conductive layers and a plurality of insulating layers, and the conductive layers and the insulating layers are alternately stacked. A stair-like step portion is provided on the periphery of the memory cell array MA. The stair-like step portion includes a plurality of steps.

Figure 2A:
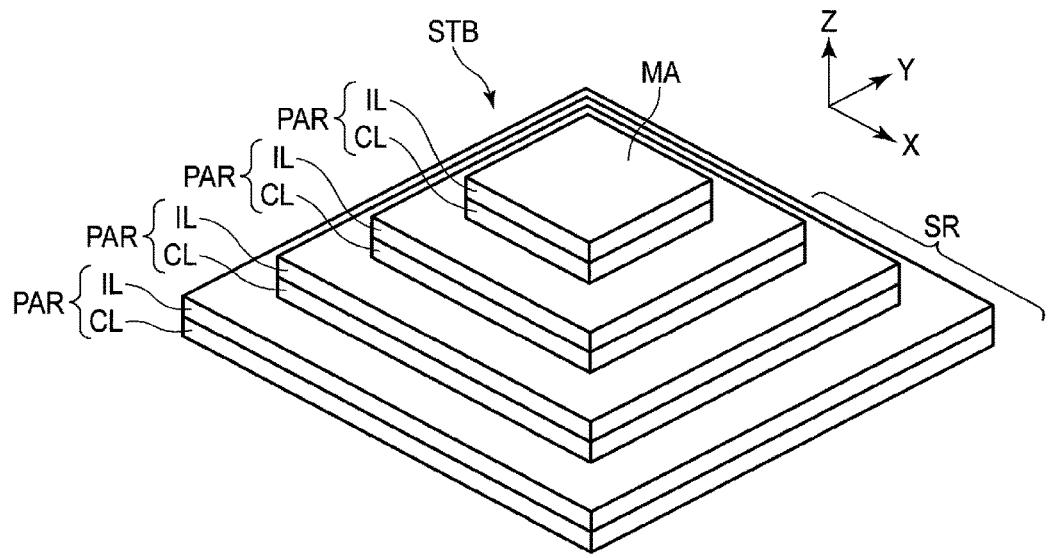
FIG. 2A is a perspective view illustrating a schematic configuration of a stack body including a memory cell array and a stair-like step portion according to the embodiment.
Figure 2B:
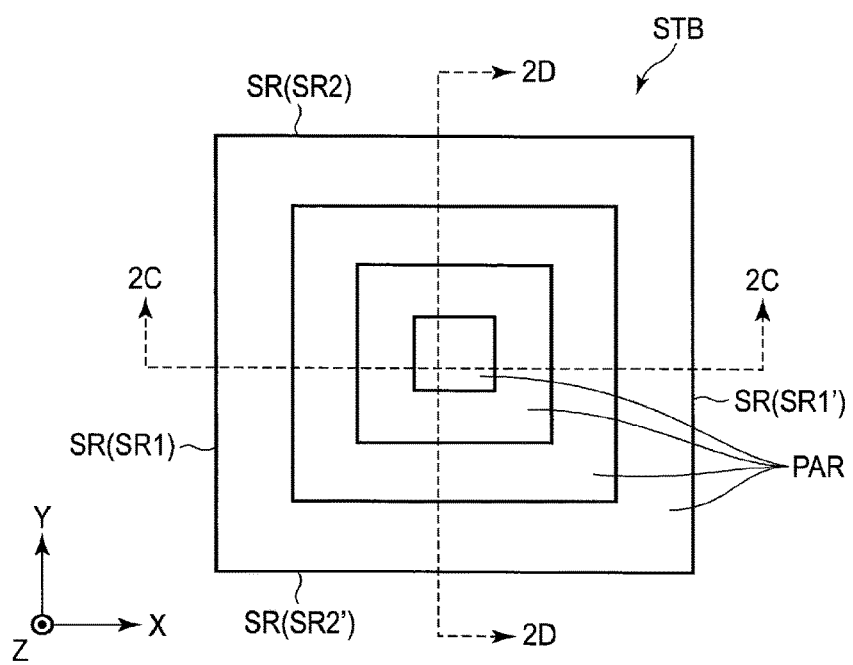
FIG. 2B is a top view illustrating the stack body including the memory cell array and the stair-like step portion according to the embodiment.

FIG. 2A is a perspective view illustrating a schematic configuration of a stack body STB which includes the memory cell array MA and the stair-like step portion SR. FIG. 2B is a top view of the stack body STB, FIG. 2C is a sectional view taken along line 2C-2C in FIG. 2B, and FIG. 2D is a sectional view taken along line 2D-2D in FIG. 2B.

As shown in FIG. 2A, the stack body STB comprises a stack structure in which a plurality of pairs PAR are stacked. The pair PAR comprises a conductive layer CL and an insulating layer IL provided thereon.

As shown in FIGS. 2C and 2D, a central portion of the stacked body STB, which has a rectangular parallelepiped shape, constitutes the memory cell array MA. A surrounding portions of the central portion of the stacked body STB constitutes the stair-like step portion SR (SR1, SR1', SR2, SR2'). The memory transistors of the memory cell array MA are not formed on the step portion SR (SR1, SR1', SR2, SR2').

As shown in FIG. 2C, a plurality of stair-like steps of the stair-like step portion (first stair-like step portion) SR1 are arranged along a minus side of the X axis (orthogonal to a longitudinal direction of the bit line). As shown in FIG. 2C, a plurality of stair-like steps of the stair-like step portion SR1' are arranged along a plus side of the X axis.

As shown in FIG. 2D, a plurality of stair-like steps of the stair-like step portion SR2 are arranged along a minus side of the Y axis. As shown in FIG. 2D, a plurality of stair-like steps of the stair-like step portion SR2' (second stair-like step portion) are arranged along a plus side of the Y axis (longitudinal direction of the bit line).

The stair-like step portion SR (SR1, SR1', SR2, SR2') is formed by sliming a resist while etching the stacked conductive layer CL and the insulating layer IL in accordance with a well-known method. Consequently, the stair-like step portion SR (SR1, SR1', SR2, SR2') is generally formed to surround four sides of the memory cell array MA (FIG. 2A).

Referring to FIG. 1 again, the row recorder RD selects the word lines and supplies the necessary voltage for operation.

The word line connection circuit SW is a switching circuit to connect the word line WL and the row recorder RD.

The bit connection circuit BLHU and the page buffer PG are arranged in a direction parallel to the Y axis of the stair-like step portion SR.

The page buffer PG includes a latch 11 and a sense amplifier 12. For example, the latch 11 and the sense amplifier 12 are provided for each of the bit lines BL. It is noted that the latch 11 and the sense amplifier 12 may not provided for each of the bit lines BL.

In the data write operation, the page buffer PG temporarily holds data supplied from the outside and transfers the data to the bit line BL, and writes the data collectively in a unit of page. In the data read operation, the page buffer PG senses and amplifies the data read on the bit line BL in the unit of page, and temporarily hold the data in the latch 11 and outputs the data to the outside. The bit connection circuit BLHU is configured to connect the bit line BL to the latch 11, or disconnect the bit line BL from the latch 11. The bit line BL is connected to the latch 11 in the data write operation and the data read operation.

The latch 11 is provided on the stair-like step portion SR, and the sense amplifier 12 is provided on a surface of a semiconductor substrate such as a silicon substrate.

Here, when the latch is formed on the surface of the semiconductor substrate, the latch is required to be formed in an area which is different from an area in which the sense amplifier is to be formed. Consequently, the chip area increases by the area for the latch. In the present embodiment, the latch is provided on the stair-like step portion SR, so that the increase of the chip area (area penalty) caused by latch 11 is suppressed. Therefore, the increase of chip area of the page buffer PG is suppressed even the capacity of the page buffer PG increases.

The capacity of the page buffer PG has increased in order to cope with the advances of the NAND type memory brought by the three-dimensional stacking structure, the high capacity by multiple-valued, or the high bandwidth. Consequently, the NAND type flash memory 10 of the present embodiment, which is capable of suppressing the increase of the chip area, has an advantage in reducing bit cost.

Figure 3:
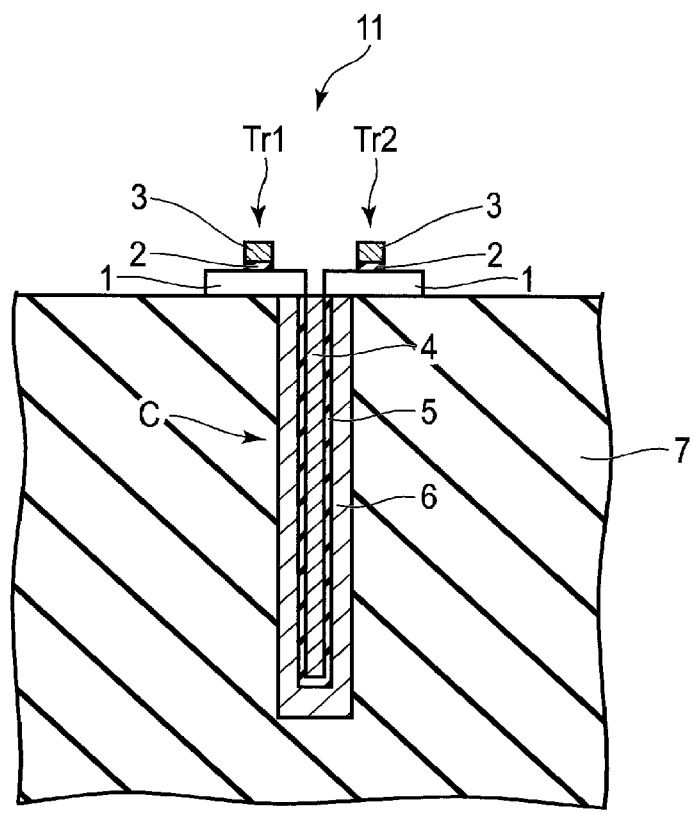
FIG. 3 is a sectional view illustrating a configuration of a latch according to an embodiment.

FIG. 3 is a sectional view illustrating a configuration of the latch 11. The latch 11 has a 2T1C cell configuration that includes two field-effect transistors Tr1 and Tr2, and one capacitor C. Hereafter, the field-effect transistor is simply referred to as the transistor.

The transistor Tr1 comprises a semiconductor layer which contains oxide semiconductor as a material (hereafter referred to as an oxide semiconductor layer) 1, a gate insulating film 2, and a gate electrode 3. The transistor Tr2 comprises a oxide semiconductor layer 1, a gate insulating film 2 and, a gate electrode 3 similar to the transistor Tr1. The transistor Tr1 and the transistor Tr2 have the same conductivity type for instance.

The oxide semiconductor layer contains, for example, oxide semiconductor such as InGaZnO, InSnZnO, InGaSnZnO, InGaSnO, AlInGaZnO, AlInSnZnO, $In_2O_3$, $Ga_2O_3$, $TiO_2$, ZnO or $SnO_2$ or the like. The oxide semiconductor layer exhibits n-type conductivity. InGaZnO, ZnO, $TiO_2$, $Ga_2O_3$, and $SnO_2$ are wide band-gap semiconductors. The gate insulating film 2 includes, for example, a silicon oxide film. The gate electrode 3 is a metal film (conductive film) which includes tantalum nitride, titanium nitride, tungsten nitride, tantalum, titanium, tungsten, aluminum or molybdenum, or alloy of tantalum, titanium, tungsten, aluminum or molybdenum.

The transistors Tr1 and Tr2 employ the oxide semiconductor layers, so that the transistors Tr1 and Tr2 can be so called junctionless field-effect transistors which do not require p-n junctions. The junctionless field-effect transistor comprises source/drain regions and a channel region, which have the same conductivity type. Consequently, the junctionless field-effect transistor in on-state is turned off by a depletion layer formed in the channel region under the gate electrode.

The transistors Tr1 and Tr2 do not need p-n junctions, so that the manufacturing process of the transistors Tr1 and Tr2 is simplified. Moreover, the transistors Tr1 and Tr2 employ the oxide semiconductor layers, so that the transistors Tr1 and Tr2 maintain high conductivity even the miniaturization of the transistors Tr1 and Tr2 is developed.

The capacitor C includes a first capacitor electrode 4, a capacitor insulating film 5 covering the side surface and the bottom surface of the first capacitor electrode 4, and a second capacitor electrode 6 covering the side surface and the bottom surface of the capacitor insulating film 5. The capacitor C is a trench capacitor formed in the insulating film 7.

One of the source/drain regions in the oxide semiconductor layer 1 of the transistor Tr1 is connected to the upper end of the second capacitor electrode 6 of the capacitor C. The other of the source/drain regions in oxide semiconductor layer 1 of the transistor Tr1 is connected to the sense amplifier (not shown).

One of the source/drain regions in the oxide semiconductor layer 1 of the transistor Tr2 is connected to the upper end of the second capacitor electrode 6 of the capacitor C. The other of the source/drain regions in oxide semiconductor layer 1 of the transistor Tr2 is connected to the bit line (not shown).

The transistors Tr1 and Tr2, which is configured to form the channel by the oxide semiconductor, is expected to have a very low off leak current characteristic of $1 \times 10^{-22}$ (A/μm). Consequently, the latch 11 including the capacitor C has a long retention time that is greater than or equal to ten days. That is, it becomes clear that the latch 11 of the embodiment can be used as almost a non-volatile memory. Thus, the lost of data held by the latch 11 is suppressed even the power supply for the page buffer PG is shut down.

On the other hand, a conventional page buffer comprises, for example, an inverter latch (volatile memory) which is constituted by inverters. The data held by the inverter latch may be lost when the power supply is shutdown. Consequently, as the page buffer has a larger memory capacity, the inverter latch may lose larger size of data. However, the latch 11 of the embodiment does not have such a problem (data lost).

Another page buffer further comprises a Fe-RAM (non-volatile memory) in addition to the inverter latch. The page buffer relocates the data in the inverter latch to the Fe-RAM when the power supply is shutdown, thereby suppressing the loss of the data. However, this page buffer requires a larger chip area. Because the Fe-RAM is formed in an area different from the area where the inverter latch is formed. In addition, the page buffer is required to relocate the data at the time of power shutdown and write back the data at the time of power recovery, thereby complicating operations of the page buffer. However, the page buffer PG of the embodiment does not have such problems (larger chip area, complicated operations).

Figure 4:
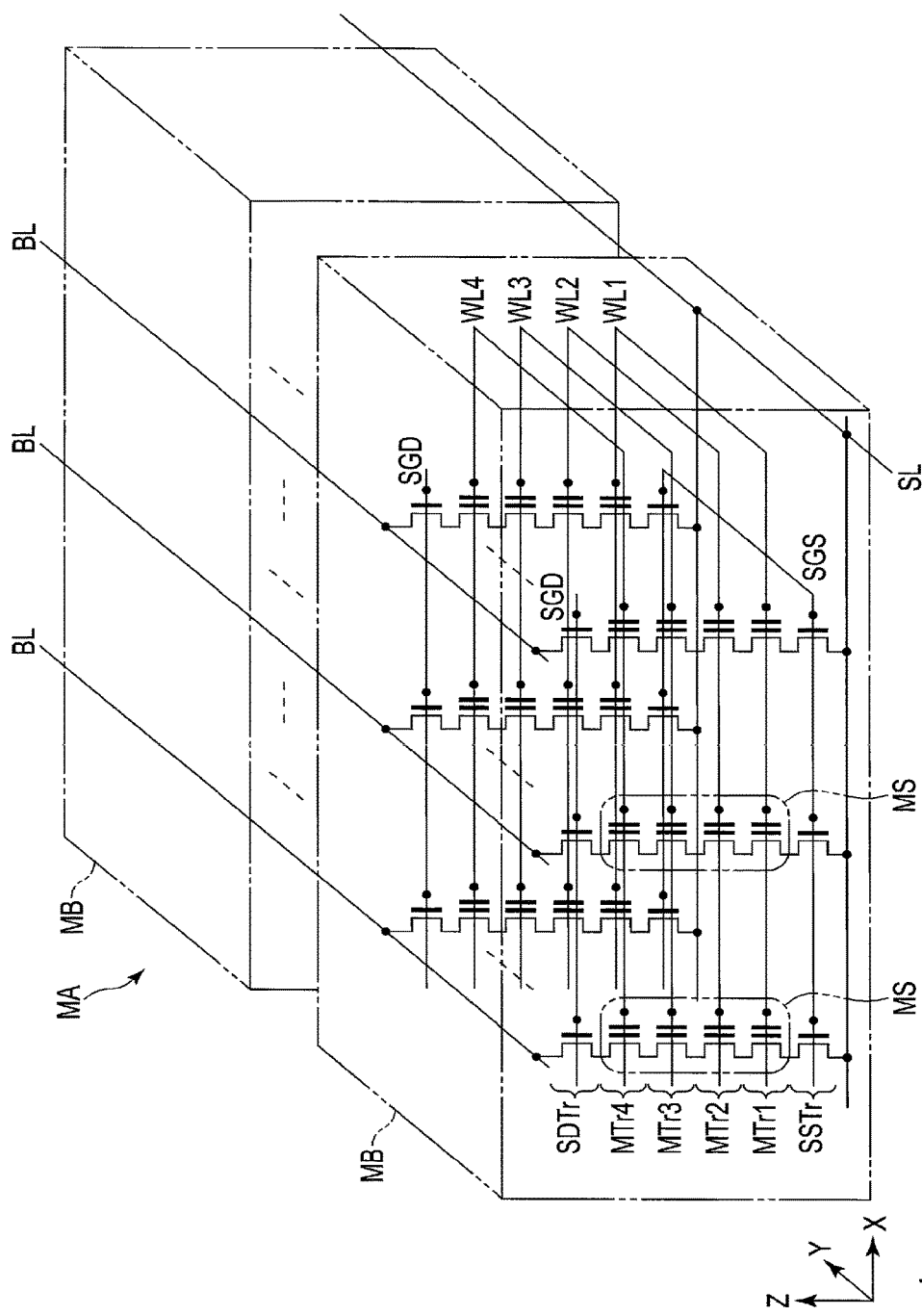
FIG. 4 is a circuit diagram illustrating a circuit configuration of a memory cell array.

Next, the memory cell array will be explained. FIG. 4 is a circuit diagram illustrating an exemplary circuit configuration of the memory cell array MA.

The memory cell array MA includes a plurality of memory blocks MB. The memory blocks MB is formed on a semiconductor substrate (not shown), and arranged in a direction parallel to the Y axis.

The memory blocks MB comprises a plurality of memory strings MS, a plurality of source side select transistors SSTr, and a plurality of drain side select transistors SDTr. The memory string MS comprises a plurality of memory transistors (memory cells) MTr1 to MTr4 connected in series. In FIG. 4, the memory string MS including four memory transistors MTr1 to MTr4 is depicted as an example, for simplicity. However, the memory string MS may include more than four memory transistors.

One of the source/drains of the drain side select transistor SDTr is connected to one end of the memory string MS (memory transistor MTr4). One of the source/drains of the source side select transistor SSTr is connected to the other end of the memory string MS (memory transistor MTr1). The memory strings MS are disposed in a matrix in the XY plane over the plurality of rows and the plurality of columns for each of the memory blocks MB.

With regard to the memory block MB, the control gates of the memory transistors MTr1 disposed in a matrix are commonly connected to the word line WL1. Similarly, the control gates of the memory transistors MTr2 are commonly connected to the word line WL2, the control gates of the memory transistors MTr3 are commonly connected to the word line WL3, and the control gates of the memory transistors MTr4 are commonly connected to the word line WL4.

With regard to the memory block MB, the control gates of the drain side select transistors SDTr arranged in a line along the X axis are commonly connected to a drain side select gate line SGD. A plurality of the drain side select gate lines SGD in one memory block MB are arranged in a line along the Y axis by a predetermined pitch. In addition, the others of source/drains of the drain side select transistors SDTr arrange in a line along the Y are commonly connected to the bit line BL. The bit line BL is formed in a manner that the bit line BL extends along the Y axis across the memory blocks MB. A plurality of bit lines BL are provided along the X axis by a predetermined pitch.

With regard to one memory block MB, the control gates of all of the source side select transistors SSTr are commonly connected to a source side select transistor SGS. In addition, the others of the source/drains of the source side select transistors SSTr arranged along the Y axis are commonly connected to the source line SL.

Figure 7:
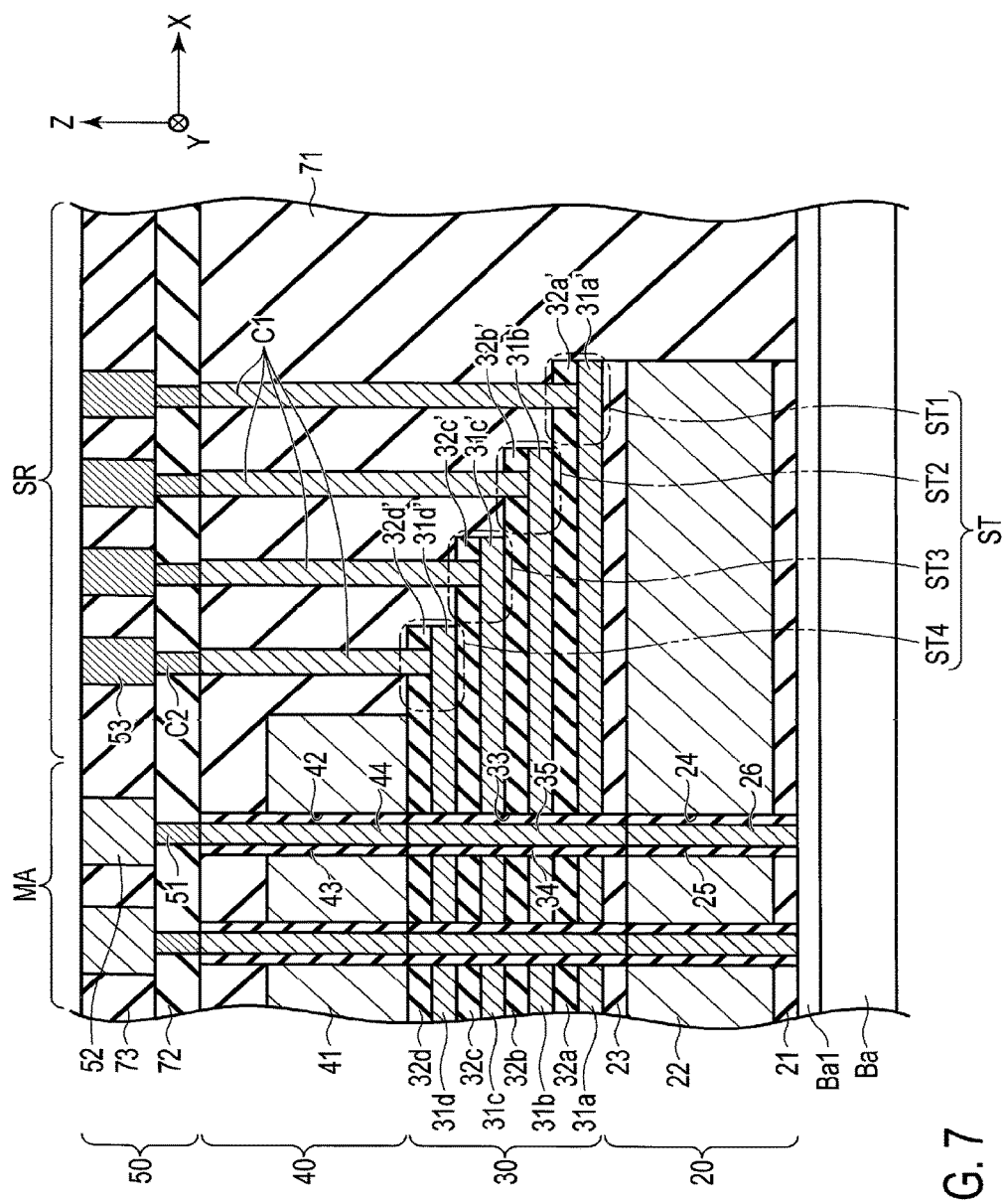
FIG. 7 is a sectional view taken along line 7-7 in FIG. 6.
Figure 8:
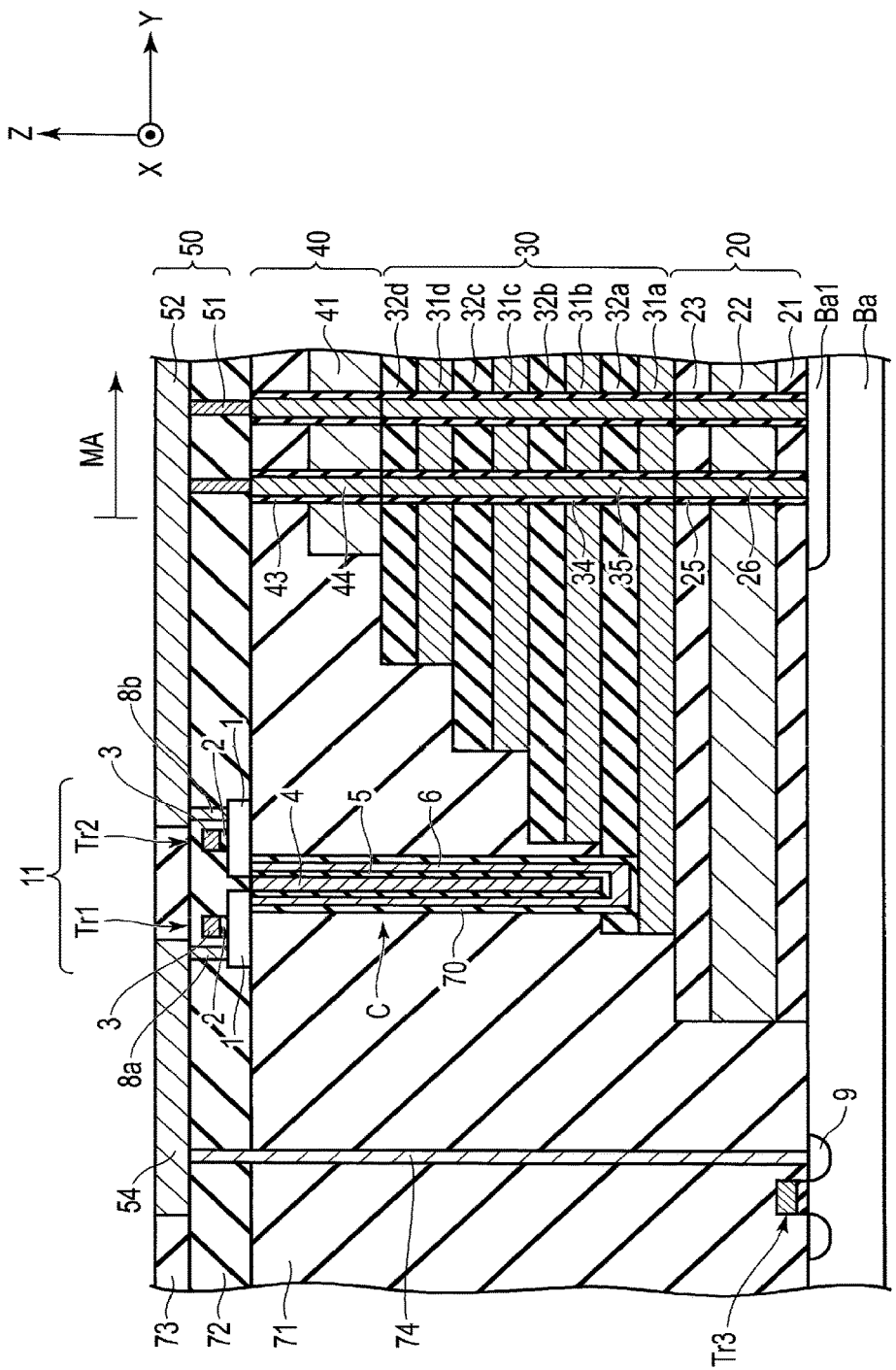
FIG. 8 is a sectional view taken along line 8-8 in FIG. 6.

FIG. 5 is a schematic perspective view of the memory cell array. FIG. 6 is a top view illustrating the peripheral circuit area, the memory cell array and the stair-like step portion of the NAND type flash memory 10. FIG. 7 is a sectional view taken along line 7-7 in FIG. 6. FIG. 8 is a sectional view taken along line 8-8 in FIG. 6. FIG. 8 is a sectional view corresponding to the FIG. 3. Moreover, insulating films 70 and 71 in FIG. 8 correspond to the insulating film 7 in FIG. 3.

As shown in FIGS. 5 and 7, the memory cell array MA includes a source side selection transistor layer 20, a memory transistor layer 30, a drain side selection transistor 40 and a interconnect layers 50, which are sequentially formed on a substrate Ba, for each of the memory block cells MB.

The source side selection transistor layer 20 is a layer that functions as the source side select transistor SSTr. The memory transistor layer 30 is a layer that functions as the memory string MS (memory transistor MTr1 to MTr4). The drain side selection transistor 40 is a layer that functions as the drain side select transistor SDTr. The interconnect layers 50 are layers function as plural kinds of interconnects.

As shown in FIG. 7, the source side selection transistor layer 20 in FIG. 5 includes a source side first insulating layer 21, a source side conductive layer 22 and a source side second insulting layer 23 which are subsequently provided on the semiconductor substrate Ba. The source side conductive layer 22 has a shape extending two dimensionally along the X axis and the Y axis (plate-like shape) under the memory block MB.

The source side first insulating layer 21 and the source side second insulating layer 23 include, for example, silicon oxide films such as $SiO_2$ films. In addition, as shown in FIG. 7, a source side hole 24 is provided in the source side selection transistor layer 20, which penetrates through the source side first insulating film 21, the source side conductive layer 22 and the source side second insulating layer 23. Though only one source side hole 24 is depicted in FIG. 7, but as viewed from above, a plurality of the source side holes are disposed in a matrix in the plane defined by the X axis and the Y axis.

As shown in FIG. 7, the source side selection transistor layer 20 includes a source side gate insulating layer 25 and a source side pillar-shaped semiconductor layer 26, which are sequentially provided on a side wall defining the source side hole 24. The source side hole 24 is filled with the source side gate insulating layer 25 and the source side pillar-shaped semiconductor layer 26.

The source side pillar-shaped semiconductor layer 26 has a pillar shape which extends along the Z axis (stacking direction). The upper surface of the source side pillar-shaped semiconductor layer 26 is in contact with the lower surface of a pillar-shaped semiconductor layer which is to be described later. The lower surface of the source side pillar-shaped semiconductor layer 26 is in contact with a diffusion layer Ba1 on the surface of the semiconductor substrate Ba. The diffusion layer Ba1 functions as a source line SL. The source side gate insulating layer 25 includes, for example, a silicon oxide film such as a $SiO_2$ film. The source side pillar-shaped semiconductor layer 26 includes, for example, a polycrystalline film.

The source side conductive layer 22 in the source side select transistor layer 20 functions as the control gate of the source side selection transistor SSTr and the source side select gate line SGS.

As shown in FIG. 5 and FIG. 7, the memory transistor layer 30 includes a first word line conductive layer 31a, a first inter-word line insulating layer 32a, a second word line conductive layer 31b, a second inter-word line insulating layer 32b, a third word line conductive layer 31c, a third inter-word line insulating layer 32c, a fourth word line conductive layer 31d, and a fourth inter-word line insulating layer 32d which are sequentially provided on the source side select transistor layer 20.

The first word line conductive layer 31a to the fourth word line conductive layer 31d, and the first inter-word line insulating layer 32a to the fourth inter-word line insulating layer 32d have shapes extending two dimensionally in a plane defined by the X axis and the Y axis (plate-like shapes). The first word line conductive layer 31a to the fourth word line conductive layer 31d, and the first inter-word line insulating layer 32a to the fourth inter-word line insulating layer 32d are segmented into memory blocks.

As shown in FIG. 7, a memory hole 33 is provided in the memory transistor layer 30, which penetrates through the first word line conductive layer 31a to the fourth word line conductive layer 31d, and the first inter-word line insulating layer 32a to the fourth inter-word line insulating layer 32d. Though only one memory hole 33 is depicted in FIG. 7, but as viewed from above, a plurality of the memory holes are disposed in a matrix in the plane defined by the X axis and the Y axis.

Figure 9:
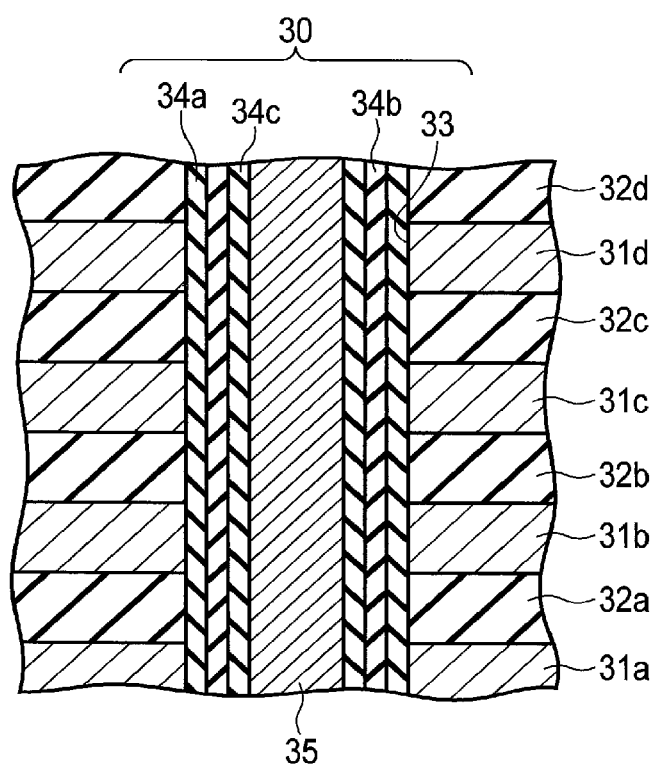
FIG. 9 is a sectional view illustrating a structure of a memory transistor layer according to an embodiment.
Figure 10:
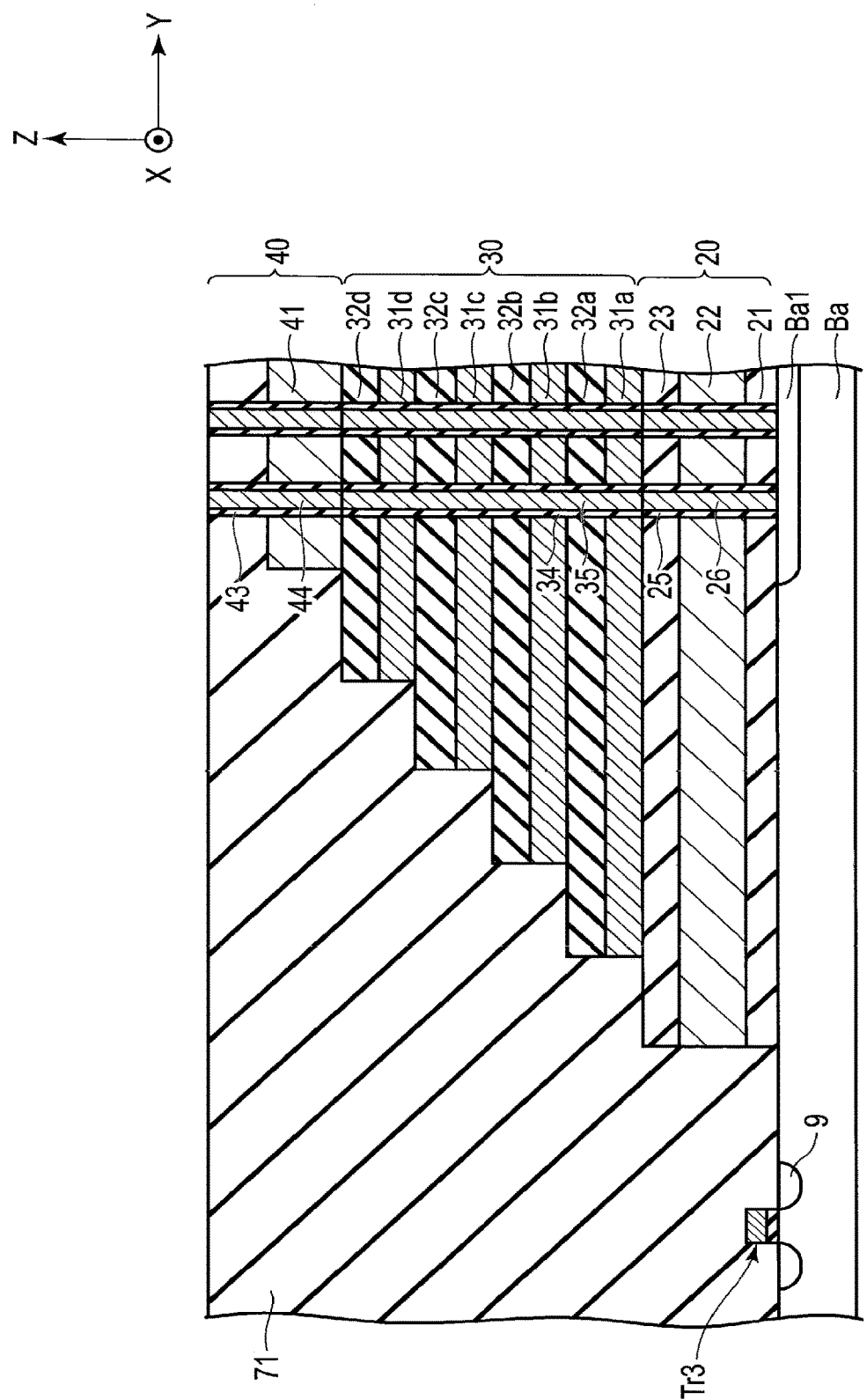
FIG. 10 is a sectional view for explaining a method of manufacturing a NAND type flash memory according to an embodiment.
Figure 13:
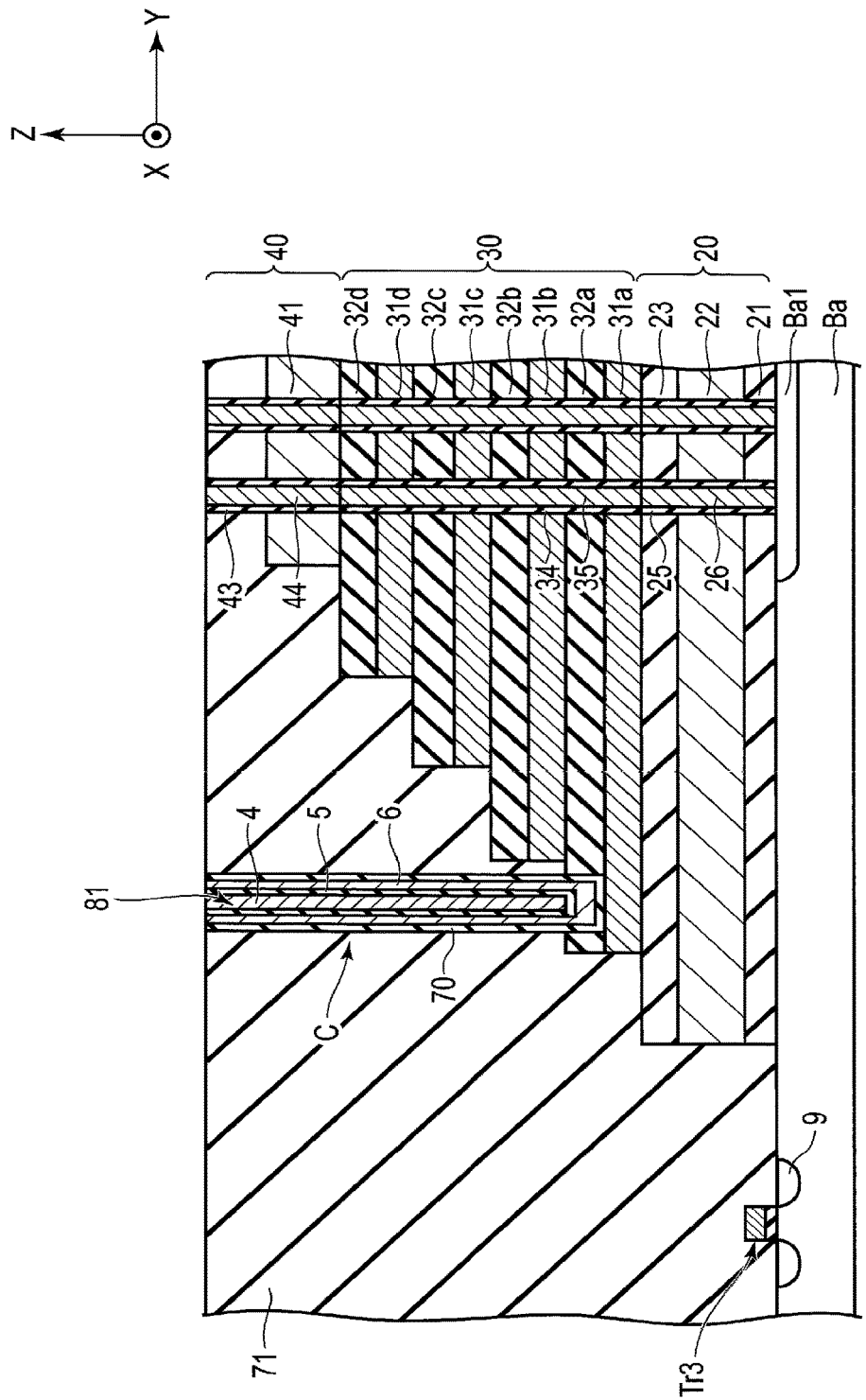
FIG. 13 is a sectional view for explaining the method of manufacturing the NAND type flash memory according to the embodiment subsequent to FIG. 12.
Figure 14:
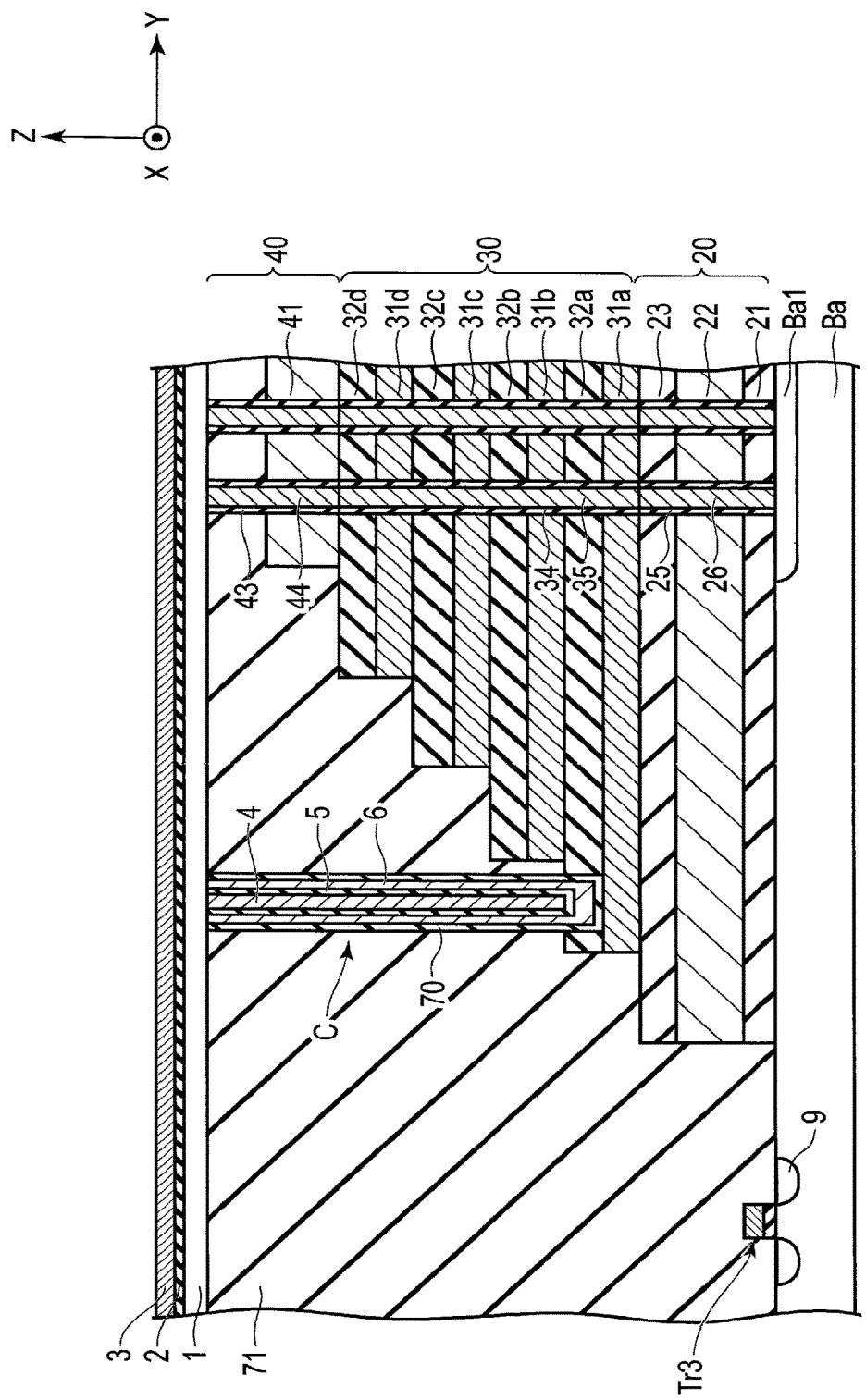
FIG. 14 is a sectional view for explaining the method of manufacturing the NAND type flash memory according to the embodiment subsequent to FIG. 13.

Moreover, as shown in FIG. 9, the memory transistor layer 30 includes a block insulating layer 34a, a charge storage layer 34b, a tunnel insulating layer 34c and a pillar-shaped semiconductor layer 35 which are sequentially provided on a side wall defining the memory hole 33.

The block insulating layer 34a is provided with a predetermined thickness on the side wall defining the memory hole 33. The charge storage layer 34b is provided with a predetermined thickness on a side wall of the block insulating layer 34a. The tunnel insulating layer 34c is provided with a predetermined thickness on a side wall of the charge storage layer 34b. The pillar-shaped semiconductor layer 35 is provided to fill the memory hole 33 via the block insulating layer 34a, the charge storage layer 34b, and the tunnel insulating layer 34c.

The pillar-shaped semiconductor layer 35 has a pillar shape which extends along the Z axis (stacking direction). The lower surface of the pillar-shaped semiconductor layer 35 is in contact with the upper surface of the source side pillar-shaped semiconductor layer 26. In the meantime, the upper surface of the pillar-shaped semiconductor layer 35 is in contact with the lower surface of a drain side pillar-shaped semiconductor layer 44 which is to be described later.

The block insulating layer 34a and the tunnel insulating layer 34c include, for example, silicon oxide films such as a $SiO_2$ films. The charge storage layer 34b includes, for example, a silicon nitride film such as a $Si_3N_4$ film. The pillar-shaped semiconductor layer 35 includes, for example, a polycrystalline film.

The first word line conductive layer 31a to the fourth word line conductive layer 31d in the memory transistor layer 30 function as control gates of the memory transistors MTr 1 to MTr 4 and the word lines WL1 to WL4.

As shown in FIG. 5 and FIG. 7, the drain side select transistor layer 40 includes a drain side conductive layer 41 provided on the memory transistor layer 30. The lower surface of the drain side conductive layer 41 is in contact with the upper surface of the pillar-shaped semiconductor layer 35. The drain side conductive layer 41 has a stripe shape extending along the X axis. Moreover, as shown in FIG. 5, the drain side conductive layers 41 are arranged along the Y axis by a predetermined pitch. The drain side conductive layer 41 includes, for example, a polycrystalline film.

In addition, as shown FIG. 7, a drain side hole 42 is provided in the drain side select transistor layer 40, which penetrates though the drain side conductive layer 41. Though only one drain side hole 42 is depicted in FIG. 7, but as viewed from above, a plurality of the drain side holes are disposed in a matrix in the plane defined by the X axis and the Y axis. The drain hole 42 is arranged at a position where the drain hole 42 is aligned with the memory hole 33 as viewed from above.

Moreover, as shown FIG. 7, the drain side select transistor layer 40 includes a drain side gate insulating layer 43 and a drain side pillar-shaped semiconductor layer 44 which are sequentially provided on a side wall defining the drain side hole 42. The drain side gate insulating layer 43 is provided with a predetermined thickness on the side wall defining the drain side hole 42. The drain side pillar-shaped semiconductor layer 44 is provided to fills the drain side hole 42. The drain side pillar-shaped semiconductor layer 44 has a pillar shape which extends along the Z axis (stacking direction). The lower surface of the drain side pillar-shaped semiconductor layer is in contact with the upper surface of the pillar-shaped semiconductor layer 35.

The drain side gate insulating layer 43 includes, for example, a silicon oxide film such as a $SiO_2$ film. The drain side pillar-shaped semiconductor layer 44 includes, for example, a polycrystalline film. The drain side conductive layer 41 functions as the control gate of the drain side select transistor SDTr and the drain side select gate line SGD.

As shown in FIG. 7, the interconnect layer 50 of the memory array MA includes a contact plug 51 and a first interconnect layer 52. The lower surface of the contact plug 51 is in contact with the upper surface of the drain side pillar-shaped semiconductor layer 44. The lower surface of the first interconnect layer 52 is in contact with the upper surface of the contact plug 51. The first interconnect layer 52 functions as the bit line BL.

As shown in FIG. 7, the stair-like step portion SR includes interconnect layers 31a' to 31d' which are formed by extending the first to fourth word line conductive layers 31a to 31d. The positions of edge portions of the interconnect layers 31a' to 31d' along the X axis are different. In addition, the lengths of the interconnect layers 31a' to 31d' are different. That is, the lengths of interconnect layers 31a', the interconnect layers 31b', the interconnect layers 31c' and interconnect layers 31d' increase in this order.

The interconnect layer 31a' is provide on the same layer as the first word line conductive layer 31a, and is electrically and physically connected to the first word line conductive layer 31a. Similarly, the interconnect layer 31b' to interconnect layer 31d' are provided on the same layers as the second word line conductive layer 31b to the fourth word line conductive layer 31d, respectively, and are electrically and physically connected to the second word line conductive layer 31b to the fourth word line conductive layer 31d, respectively. In other words, the interconnect layers 31a' to 31d' are integrally formed with the word line conductive layer 31a to 31d, respectively.

The stair-like step portion SR further includes interlayer insulating layers 32a' to 32d' which are formed by extending the first to fourth inter-word line insulating layers 32a to 32d. Edge portions of the interlayer insulating layers 32a' to 32d' along the X axis are aligned with edge portions of the interconnect layers 31a' to 31d', respectively.

The interlayer insulating layers 32a' is provided on the same layers as the first inter-word line insulating layers 32a, and is physically connected to the first inter-word line insulating layers 32a. Similarly, the interlayer insulating layers 32b' to 32d' are provided on the same layers as the second to fourth inter-word line insulating layers 32b to 32d, respectively, and are physically connected to the second to fourth inter-word line insulating layers 32b to 32d, respectively. In other words, the interlayer insulating layers 32a' to 32d' are integrally formed with the first to fourth inter-word line insulating layers 32a to 32d, respectively.

The interconnect layer 31a', the interlayer insulating layers 32a', the interconnect layer 31b', the interlayer insulating layers 32b', the interconnect layer 31c', the interlayer insulating layers 32c', the interconnect layer 31d' and the interlayer insulating layers 32d' are stacked in this order, and these layers 31a', 32a', 31b', 32b', 31c', 32c', 31d' and 32d' constitute a step portion ST. Specifically, the step portion ST shown in FIG. 7 includes step portions ST1 to ST4 whose positions of edge portions along the X axis are different. The step portion ST1 is constituted by the interconnect layer 31a' and the interlayer insulating layers 32a'. Similarly, the step portion ST2 is constituted by the interconnect layer 31b' and the interlayer insulating layers 32b', the step portion ST3 is constituted by the interconnect layer 31c' and the interlayer insulating layers 32c', and the step portion ST4 is constituted by the interconnect layer 31d' and the interlayer insulating layers 32d'. A contact plug C1 extends along the Z axis from each of the step portions ST1 to ST4.

Four conductive layers constituted by layers 31a to 31d and 31a' to 31d' correspond to the four conductive layers CL shown in FIG. 2A. Four insulating layer constituted by the layer 32a to 32d and 32a' to 32d' shown in FIG. 7 correspond to the four insulating layers IL shown in FIG. 2A. The step portions ST1 to ST4 in FIG. 7 correspond to, for example, the stair-like step portion SR2' in FIG. 2D.

As shown in FIG. 7, the interconnect layer 50 of the step portions ST includes a contact plug C2 and a second interconnect layer 53. The lower surface of the contact plug C2 is in contact with the upper surface of the contact plug C1. The lower surface of the second interconnect layer 53 is in contact with the upper surface of the contact plug C2. The second interconnect layer 53 functions as the word line WL.

FIG. 10 to FIG. 15 are sectional views for explaining a method of manufacturing the NAND type flash memory according to an embodiment, and more particularly, FIG. 10 to FIG. 15 are sectional views for explaining a method of manufacturing the latch constituting the page buffer. FIG. 10 to FIG. 15 correspond to the sectional views taken along line 8-8 in the top view of FIG. 6.

[FIG. 10]

The diffusion layer Ba1, the MOS transistor Tr3 constituting the sense amplifier, the source side select transistor layer 20, the memory transistor layer 30, the drain side select transistor layer 40 and the insulating film 71 are formed on the semiconductor substrate Ba by using well-know method.

[FIG. 11]

In the step of forming the hole that is to be filled with the contact plug C1 of FIG. 7, a trench 81 is also formed, in which the capacitor constituting the latch is to be formed. The trench 81 is formed by using photolithography process and etching process.

In the present embodiment, the trench 81 is formed to reach the upper surface of the conductive layer 31a. However, the trench 81 may be formed to reach the upper surface of the conductive layer 31b, the upper surface of the conductive layer 31c or the upper surface of the conductive layer 31d. That is, the trench 81 is formed to reach the upper surface of the conductive layer corresponding to the depth where necessary capacitance for the capacitor is ensured. The depth of the trench 81 is, for example, 3 μm.

[FIG. 12]

The insulating film 70 is formed on an area including the insulating film 71 to cover the side surface and the bottom surface of the trench 81, and then a conductive film 6 to be processed into the second capacitor electrode, an insulting film 5 to be processed into the capacitor insulating film and a conductive film 4 to be processed into the first capacitor electrode are sequentially formed on the insulating film 70. The conductive film 4 is formed to fill the trench 81.

[FIG. 13]

The conductive film 4, the insulating film 5, the conductive film 6 and the insulating film 70, which are outside the trench 81, is removed by using chemical mechanical polishing (CMP), and the surfaces exposed by removing these films 4, 5, 6, and 70 are planarized by the CMP. In this process, the formation of the capacitor C constituting the latch is completed. In the following process, the conductive film 4, the insulating film 5 and the conductive film 6 are referred to as the first capacitor electrode 4, the capacitor insulating film 5 and the second capacitor electrode 6, respectively.

[FIG. 14]

The oxide semiconductor layer 1 is formed on an area including the insulating film 71, and then an insulating film 2 to be processed into the gate insulating film, a conductive film 3 to be processed into the conductive film are sequentially formed on the oxide semiconductor layer 1. The oxide semiconductor layer 1 is formed to be in contact with the upper surfaces of the oxide semiconductor layer 1, the first capacitor electrode 4, the capacitor insulating film 5 and the second capacitor electrode 6.

[FIG. 15]

Two gate electrodes 3 and two gate insulating films 3 are formed by sequentially patterning the conductive film 3 and the insulating film 2. More particularly, a resist pattern (not shown) is formed on the conductive film 3 shown in FIG. 14, and the conductive film 3 is etched by using the resist pattern as a mask, thereby forming the two gate electrodes 3, and subsequently the insulating film 2 is etched by using the resist pattern as a mask, thereby forming the two gate insulating films 2.

Thereafter two transistors Tr1 and Tr2 are obtained by patterning the oxide semiconductor layer 1. More particularly, a resist pattern (not shown) is formed on the oxide semiconductor 1 and the gate electrode 3, and then the oxide semiconductor layer 1 is etched by using the resist pattern as a mask, thereby forming the two transistors Tr1 and Tr2.

Thereafter the interlayer insulating film 72, the contact plugs 8a, 8b, 51 and 74, the interlayer insulating film 73, the first interconnect layer (bit line) 52, the second interconnect layer (not shown), and the third interconnect layer 54 are formed by using well-known method, thereby obtaining the structure shown in FIG. 8.

As shown in FIG. 8, one of the source/drain regions of the transistor Tr1 is connected to one of the source/drain regions of the MOS transistor Tr3 constituting the sense amplifier via the plug 8a, the third interconnect layer 54 and the plug 74. One of the source/drain regions of the transistor Tr2 is connected to the first interconnect layer (BL line) 52 via the plug 8b.

The source side select transistor layer 20, the memory transistor layer 30 and the drain side select transistor layer 40 in FIG. 8 constitute a stair-like step portion. This stair-like step portion corresponds to the stair-like step portion SR1 in FIG. 2B when the step portions ST1 to ST4 in FIG. 7 correspond to the stair-like step portion SR2'.

Figure 16:
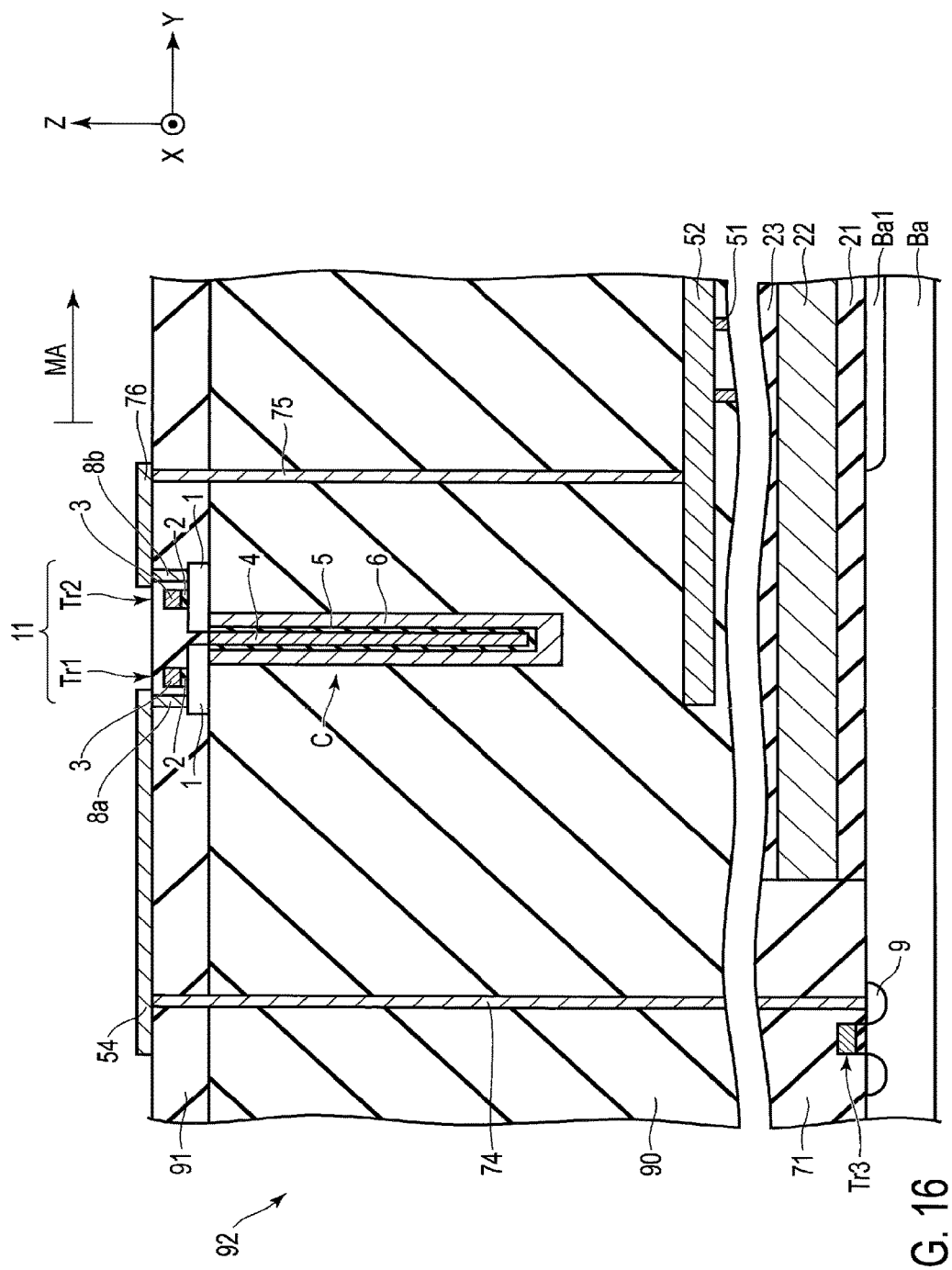
FIG. 16 is a sectional view for explaining a NAND type flash memory according to another embodiment.

In the present embodiment, the latch 11 is provided between the bit line and the stair-like step portion, however the latch 11 may be provided in a region above the first interconnect layer (bit line) 52 as shown in FIG. 16. The region is an unoccupied space where no interconnect layer, element and the like are disposed.

Noted that, in FIG. 16, reference symbol 75 denotes a contact plug, reference symbol 76 denotes an interconnect layer, reference symbols 90 and 91 denote interlayer insulating films. The contact plug 75 penetrates through the interlayer insulating films 90 and 91. The interconnect layer 76 is provided on the interlayer insulating layer 91. The transistor Tr2 is connected to the first interconnect layer (bit line) 52 via the contact plug 8b, the interconnect layer 76 and the contact plug 75.

Moreover, the transistors Tr1 and Tr2, and the capacitor C may be formed in a region 92 shown in FIG. 16. The region 92 is located above the peripheral circuit area, and is an unoccupied space where no interconnect, element and the like are formed.

Furthermore, in the present embodiment, the NAND type flash memory 10 employing a linear type memory string MS is explained, however a NAND type flash memory employing a pipe type memory string may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a semiconductor substrate;
   a memory cell array provided on the semiconductor substrate, and comprising a plurality of memory transistors, the plurality of memory transistors being electrically rewritable and arranged in a three-dimensional manner; and
   a latch provided above the semiconductor substrate and configured to hold data that is to be written in the memory cell array, and the latch comprising a capacitor and a first field- effect transistor which is connected to the capacitor and comprises a first oxide semiconductor layer, and a second field-effect transistor which is connected to the capacitor and comprises a second oxide semiconductor layer.

2. The device of claim 1, wherein the first field-effect transistor further comprises:
   a pair of first source/drain regions provided in the first oxide semiconductor layer, and
   a channel region provided between the pair of first source/drain regions, and having a conductivity type that is same as a conductivity type of the pair of first source/drain regions.

3. The device of claim 1, wherein the second field-effect transistor further comprises:
   a pair of second source/drain regions provided in the second oxide semiconductor layer, and
   a channel region provided between the pair of second source/drain regions, and having a conductivity type that is same as a conductive type of the pair of second source/drain regions.

4. The device of claim 1, wherein the first field-effect transistor and the second field-effect transistor are connected in series, and the capacitor is connected to a connection node of the first field-effect transistor and the second field-effect transistor.

5. The device of claim 1, wherein the first field-effect transistor and the second field-effect transistor each further comprises a gate electrode which contains copper, tantalum nitride, titanium nitride, tungsten nitride, tantalum, titanium, tungsten, aluminum or molybdenum, or alloy of tantalum, titanium, tungsten, aluminum or molybdenum.

6. The device of claim 1, wherein the oxide semiconductor layer contains InGaZnO, InSnZnO, InGaSnZnO, InGaSnO, AlInGaZnO, AlInSnZnO, $In_2O_3$, $Ga_2O_3$, $TiO_2$, ZnO, or $SnO_2$.

7. The device of claim 1, wherein the second oxide semiconductor layer contains InGaZnO, InSnZnO, InGaSnZnO, InGaSnO, AlInGaZnO, AlInSnZnO, $In_2O_3$, $Ga_2O_3$, $TiO_2$, ZnO, or $SnO_2$.

8. The device of claim 1, wherein the latch constitutes a page buffer.

9. The device of claim 4, further comprises a sense amplifier and a bit line, wherein the first field-effect transistor of the latch is connected to the sense amplifier, and the second field-effect transistor of the latch is connected to the bit line.

10. The device of claim 9, wherein the latch is disposed lower than the bit line.

11. The device of claim 9, wherein the latch is disposed higher than the bit line.

12. The device of claim 1, further comprising a stair-like step portion including a plurality of steps provided around the memory cell array, wherein the stair-like step portion including a first stair-like step portion including a plurality of steps, and the latch is disposed on the first stair-like step portion.

13. The device of claim 12, wherein the plurality of steps of the first stair-like step portion are arranged along a direction perpendicular to a longitudinal direction of the bit line as viewed from above.

14. The device of claim 12, wherein the stair-like step portion further includes a second stair-like step portion including a plurality of steps.

15. The device of claim 14, wherein the plurality of steps of the second stair-like step portion are arranged along the longitudinal direction of the bit line as viewed from above.

16. The device of claim 14, further comprising a plug connected to a conductive layer constituting one of the plurality of steps of the second stair-like step portion.

17. The device of claim 1, wherein the latch is disposed above a surface of the semiconductor outside the memory cell array.

18. The device of claim 1, wherein the plurality of memory transistors are connected in series.

* * * * *